United States Patent [19]

Davis et al.

[11] 4,291,277

[45] Sep. 22, 1981

[54] ADAPTIVE PREDISTORTION TECHNIQUE FOR LINEARIZING A POWER AMPLIFIER FOR DIGITAL DATA SYSTEMS

[75] Inventors: Robert C. Davis, Indialantic; Robert W. Boyd, Melbourne, both of Fla.

[73] Assignee: Harris Corporation, Melbourne, Fla.

[21] Appl. No.: 39,362

[22] Filed: May 16, 1979

[51] Int. Cl.³ .............................................. H03F 1/32
[52] U.S. Cl. ...................................... 330/149; 375/60
[58] Field of Search ................ 330/149; 328/162, 163; 375/60, 39; 455/63

[56] References Cited

FOREIGN PATENT DOCUMENTS 1246209 9/1971 United Kingdom ................. 330/149

Primary Examiner—James B. Mullins
Attorney, Agent, or Firm—Craig and Antonelli

[57] ABSTRACT

Distortion introduced into a multiamplitude signal format by a high power microwave amplifier is compensated by a system which adapts itself to non-linearities present in the amplifier and predistorts the input signals before they are subjected to the non-linearities created by the amplifier. The degree of predistortion is non-fixed and varies or is updated as the non-linear conversion characteristics of the amplifier change with time.

17 Claims, 4 Drawing Figures

ADAPTIVE PREDISTORTION TECHNIQUE FOR LINEARIZING A POWER AMPLIFIER FOR DIGITAL DATA SYSTEMS

The U.S. Government has rights in this invention pursuant to Contract No. F30602-77-C-0039, awarded by the Department of the Air Force.

FIELD OF THE INVENTION

The present invention relates to communication systems and is particularly directed to a system for counteracting the non-linear behavior of microwave power amplifiers, such as solid state power amplifiers and travelling wave tube amplifiers used in such systems for amplifying digital signals to be transmitted.

BACKGROUND OF THE INVENTION

Present day communication systems, whether they are used for transmitting analog data or transmitting digital data, employ high power microwave amplifiers, such as solid state power amplifiers and travelling wave tube (TWT) amplifiers, as part of the signal transmission or transponder sections of the system. Unfortunately, such power amplifiers have extremely non-linear AM/AM and AM/PM conversion characteristics that cause serious distortion of multi or varying amplitude signals passed through them. This distortion is a primary impediment to reliable spectrally-efficient digital signalling through such an amplifier.

FIG. 1 is a graph of the typical non-linear conversion behavior of a microwave power amplifier. In the FIG. 1, curve 1 is a plot of output signal power and curve 2 is a plot of output phase shift, each curve plotted relative to input signal power for a sinusoidal signal. As can be seen from the curves presented in FIG. 1, the variations of both output signal power and phase shift of the amplifier are non-linear over a considerable range of input signal power.

One way to avoid the distortion effects exhibited in FIG. 1 for digital modulation signalling would be to use constant envelope type signals, such as unfiltered PSK or FSK modulated signals. Unfortunately, such signalling schemes generally require a higher signal-to-noise ratio for a prescribed level of performance than those types of modulation (such as QAM) that employ variations in amplitude to represent the data. The performance disparity between constant and non-constant amplitude signals becomes larger as the number of bits/sec/Hz is increased. Accordingly, if the performance efficiency of a non-constant amplitude signal modulation scheme is to be obtained, the AM/AM and AM/PM distortion characteristics such as illustrated in FIG. 1 must be compensated.

One brute force approach for reducing the effects of such distortion would be to reduce the drive level into the amplifier, so that the amplifier output power is considerably below saturation (power amplifier back off) where the magnitudes of the AM/AM and AM/PM distortion are tolerable. While this technique has been found to be useful and has been widely employed with TWT amplifiers, it loses a great deal of its appeal if the amplifier has to be backed off excessively in order to obtain acceptable distortion levels, since every dB of amplifier back off causes a loss in a dB of radiated power. For high data rate per Hz systems, acceptable distortion levels are generally in a region of 35 to 50 dB down and, in order to obtain such levels, the amplifier must be backed off excessively.

SUMMARY OF THE INVENTION

Pursuant to the present invention, the distortion introduced into a multiamplitude signal format by a high power microwave amplifier is compensated without having to resort to the power back off approach discussed above. To this end, the inventive system adapts itself to non-linearities present in the amplifier and predistorts the input signals before they are subjected to the non-linearities created by the amplifier. The degree of predistortion is non-fixed and varies or is updated as the non-linear conversion characteristics of the amplifier change with time.

In accordance with a preferred implementation of the present invention, each digital data symbol to be transmitted in accordance with a multiamplitude modulation scheme is coupled, a prescribed number of bits at a time, to a temporary storage buffer and to a read only memory in which a look up table, comprised of plural digital codes representative of prescribed in-phase (I) and quadrature (Q) reference voltages, is stored. The data bits stored in the buffer define an address of a predistortion random access memory, to which the buffer is coupled, and these bits are used to access a pair of digital codes stored in the RAM for respective I and Q components for each symbol time. These digital codes are converted into analog format, filtered and then up-converted to a composite signal in the intermediate frequency (IF) range. The IF signal is then mixed with the RF carrier and applied to the microwave power amplifier for transmission.

Adaptive correction of non-linearities introduced by the amplifier is effected by feeding back part of the amplifier output to a comparator network to be compared with the I and Q reference voltages supplied by look up table stored in the read only memory. The feedback circuitry includes necessary down-conversion components to reduce the RF output signal to baseband. Any differences between the I and Q outputs of the microwave amplifier and the respective reference voltages corresponding to the codes derived from the read only memory are summed with the I and Q components read out of the predistortion random access memory and are written into the presently addressed locations of the random access memory as updated predistorted I and Q components.

With this scheme, variations in the amplifier distortion characteristics are tracked continuously, thereby allowing the system to learn the behavior of the amplifier and to adapt itself to amplifier non-linearities. The present invention has been shown to be effective even with the severe AM/AM and AM/PM conversion characteristics of TWT amplifiers.

DETAILED DESCRIPTION

Prior to describing, in detail, the adaptive predistortion linearizing scheme according to the present invention, the effect of AM/AM and AM/PM distortion and the manner in which it is compensated, for an individual signal component, will be initially discussed.

Figure 1:
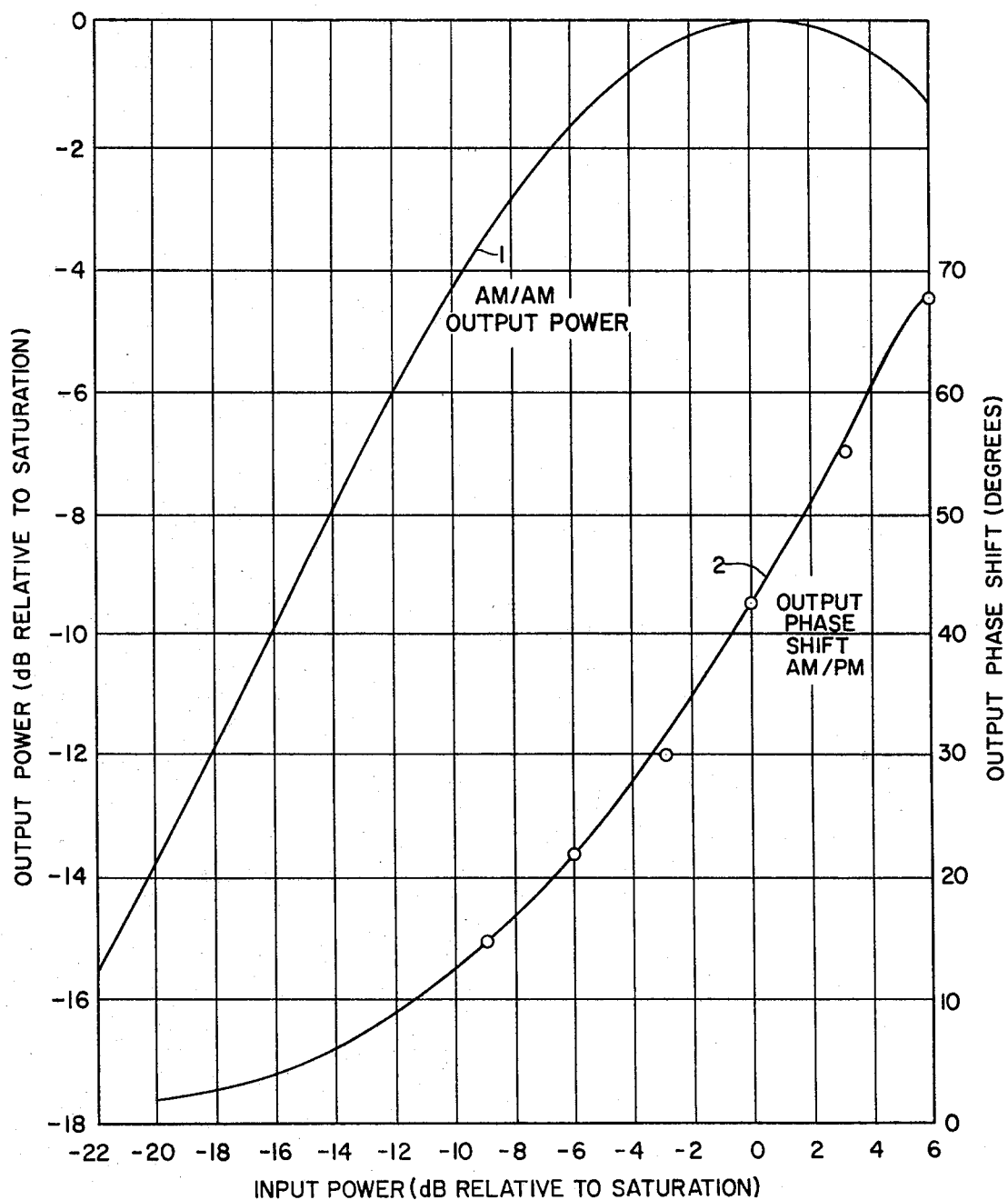
FIG. 1 is a graph of the typical nonlinear AM/AM and AM/PM conversion characteristics of a high power microwave amplifier.
Figure 2:
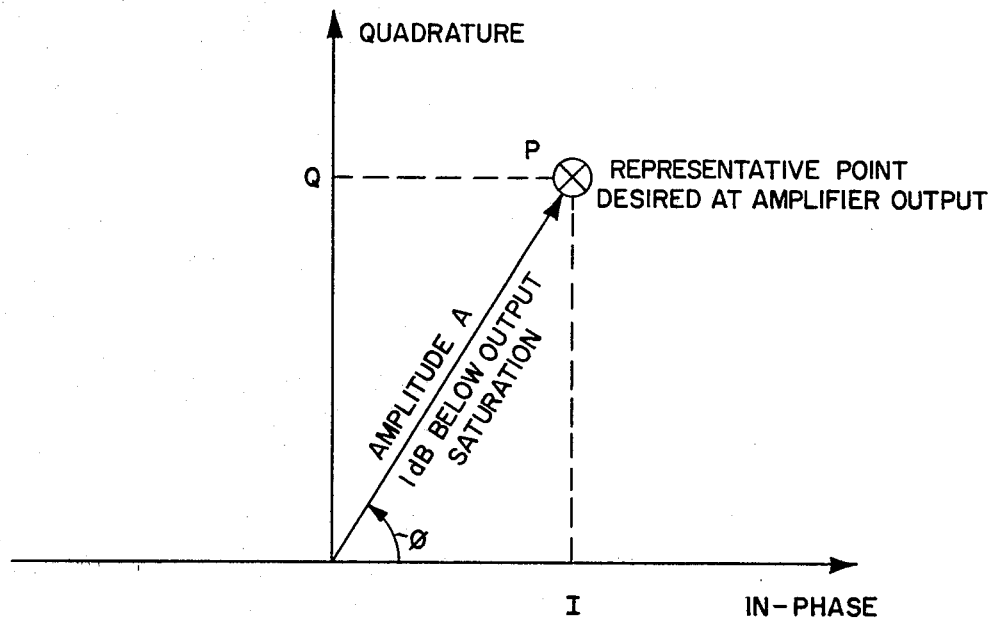
FIGS. 2 and 3 are in phase-vs-quadrature signal component plots for a multiamplitude signal.

FIG. 2 shows a representative signal space point P to be transimitted in accordance with a multiamplitude digital modulation format. The horizontal or x-axis represents the in-phase (I) component of the signal and the vertical or y-axis represents the quadrature (Q) component of the signal. The signal point P may be defined by its amplitude A and phase $\phi$ relative to the x-axis. Signal point P may also be defined in accordance with its two constituent I and Q components. For the purpose of the present discussion it will be assumed that signal point P is to be produced at the output of an amplifier having the AM/AM and AM/PM characteristics shown in FIG. 1. It will be further assumed that the output signal amplitude from the amplifier is to be one dB below saturation when signal point P is produced.

Figure 3:
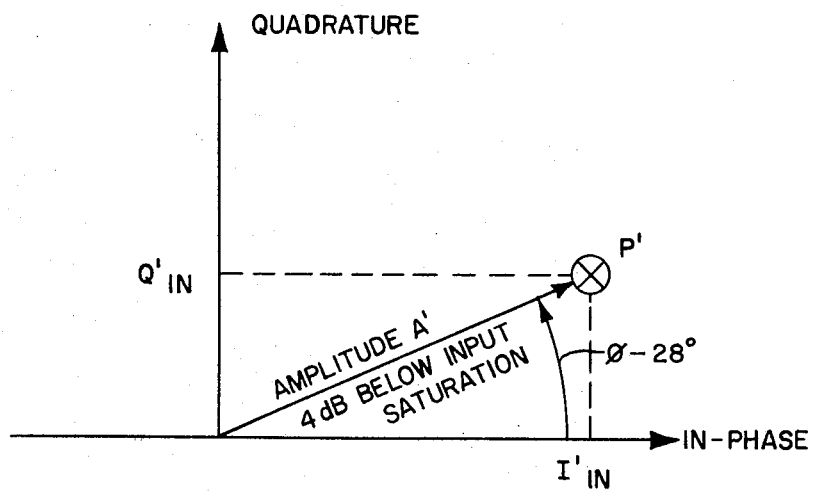

From AM/AM curve 1 FIG. 1, it can be seen that the necessary input amplitude is approximately four dB below the input which yields output saturation. From the AM/PM curve 2 of FIG. 1, it is seen that a signal having an input power level four dB below saturation input incurs $+28°$ of phase shift in passing through the amplifier. To compensate for this $+28°$ of phase shift and to produce the output point P of FIG. 2, the phase of input signal to the amplifier must be retarded by 28°. The resulting signal is a "predistored" input signal shown in the two-dimension signal quadrature-vs-in phase plot of FIG. 3. When the signal shown in FIG. 3 is applied to the input of the amplifier, the signal point P shown in FIG. 2 is produced. Thus, for the examplary digital signal point P shown in FIG. 2 there exists a combination of input amplitude A' and phase ($\phi - 28°$) or, alternatively, an in phase component $I_{IN}'$ and a quadrature component $Q_{IN}'$ that will cause the nonlinear amplifier to produce the desired signal point P, shown in FIG. 2, at its output. By applying the above-described predistortion correction scheme for each signal point that may be transmitted through the non-linear amplifier, every corresponding output signal can be produced free of amplifier distortion at the signalling times.

One possible approach for imparting this predistortion to each signal sample would be to simply store fixed distorted input in phase and quadrature components for each of the discrete points that make up the digital multiamplitude modulation scheme. Then, as each symbol is configured at the modulator, the appropriate pair of signal components could be accessed from a look-up table stored in a memory. Unfortunately, for such a fixed predistortion scheme, if the AM/AM and AM/PM characteristics of the amplifier change, the fixed predistortion scheme is no longer accurate and severe degradation in performance can result, especially for a high data rate signalling format.

As was described briefly above, pursuant to the present invention, there is an adaptive non linearity correction scheme, whereby the non-linear behavior of the microwave amplifier is continuously monitored and predistortion signal components are updated, so as to enable the system to track variations in the amplifiers AM/AM and AM/PM characteristics.

Figure 4:
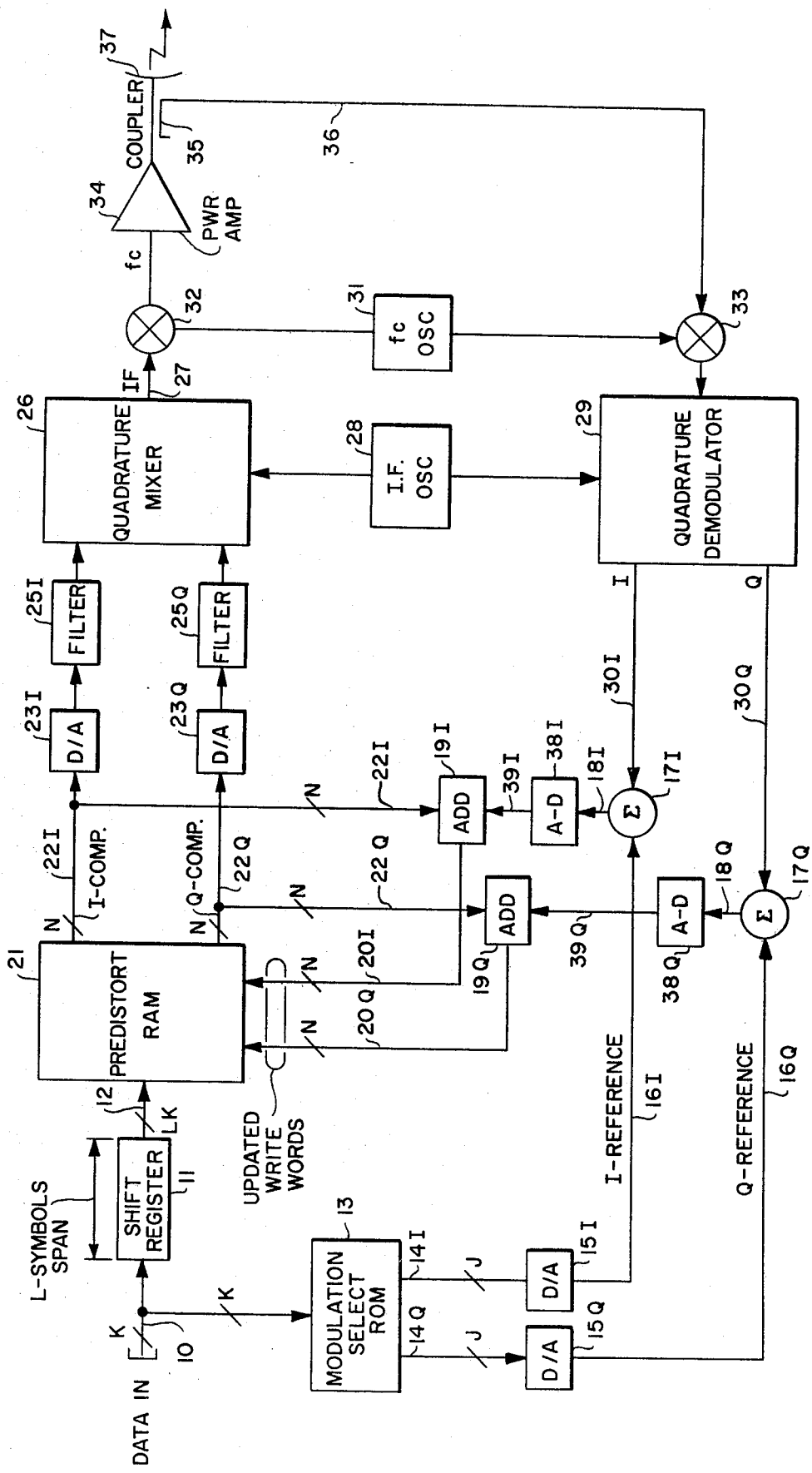
FIG. 4 is a schematic block diagram of the adaptive predistortion system in accordance with a preferred embodiment of the present invention.

FIG. 4 shows a schematic block diagram of an embodiment of the present invention for adaptively predistorting digital signals prior to passing them through a non-linear microwave power amplifier. The components, per se, of which the present invention is configured are conventional, so that a detailed explanation of the same, which is unnecessary for an understanding of the interconnection and operation of the present invention, will not be presented in order to keep the description consise. In this regard, signal timing lines which supply the appropriate timing signals to the digital components of FIG. 4 in a straightforward manner in accordance with the operation of FIG. 4 described below have been omitted for clarity.

Referring now to FIG. 4, digital data to be transmitted in accordance with a multiamplitude modulation format (such as QAM modulation) is coupled over input line 10 to shift register 11 and to the address input of a modulation read only memory (ROM) 13. Input line 10 is coupled to the output of a suitable encoder (not shown) that has converted data to be transmitted into the appropriate digital codes that are to control the modulation carried out by the system shown in FIG. 4. A detailed description of the source of the information and the encoding technique per se are not necessary for an understanding of the present invention and, accordingly, are not described herein. For purposes of the present explanation, the data is assumed to be parallel format; however, it may also be coupled in serial format with the appropriate buffer and timing control provided to ensure signal processing compatibility. For each symbol time, K data bits, representative of some symbol or signal point P in the two dimensional multiamplitude signal space, as described above in conjunction with FIGS. 2 and 3, are coupled over input line 10 to a shift register 11 having a capacity of L symbols. In general, the length L of shift register 11 may be longer than one symbol, if there exist memoryful linear distortions due to system filtering. However, by omitting system filtering prior to signal coupler 35, as shown in FIG. 4, the length L of shift register 11 need be only one symbol span in order that the essentially memoryless AM/AM and AM/PM conversion nonlinearities can be removed. Confining the length L of shift register 11 to one symbol span also keeps the required capacity of RAM 21 to a reasonable size.

The K data bits on line 10 are also used to access a pair of J-bit words in ROM 13. ROM 13 has stored therein a modulation selection look-up table containing plural pairs of digital codes of J-bits each, representative of I and Q signal voltage components to be transmitted in accordance with the K-bit digital symbol value received over input line 10. One of the J-bit words, read out on line 14I, represents an in phase (I) reference voltage, while the other of the J-bit words, read out on line 14Q, represents a quadrature (Q) reference voltage for the selected digital modulation signal format. The digital values of the J-bit words are converted into analog format by digital-to-analog (D/A) converters 15I and 15Q, respectively. The analog values of the reference voltages are coupled over lines 16I and 16Q to comparators 17I and 17Q, respectively, to be subtracted from (compared with) signal voltages fed back from the output of non-linear amplifier 34, as will be explained in detail below. Error signals produced by comparators 17I and 17Q are used to update digital codes stored in a predistortion random access memory (RAM) 21 in a direction such as to reduce the error, as will be discussed more fully below.

Predistortion RAM 21 is addressed by the contents of shift register 11, i.e. L·K data bits, so that RAM 21 produces on output lines 22I and 22Q, respectively, an N-bit in phase component word and an N-bit quadrature component word, at each symbol time. These accessed N-bit I and Q component words read out of predistortion RAM 21 represent those I and Q signal values which should cause microwave power amplifier 34 to produce the desired data symbol point P, absent distortion, as described above in conjunction with the description of FIGS. 1, 2 and 3. These predistortion digital values are converted into analog format by respective digital-to-analog converter 23I and 23Q, the outputs of which are suitably filtered in filters 25I and 25Q and applied to quadrature mixer 26. Quadrature mixer 26 includes a pair of multipliers, a 90° phase shifter, high pass filter and an adder (not shown). The IF frequency from oscillator 28 is applied through the phase shifter of quadrature mixer 26 to one of its multipliers and directly to the other multiplier. The respective SIN and COS IF frequencies are multiplied by the symbol analog signals from filters 25I and 25Q, respectively, summed and filtered to produce a predistored IF signal on line 27.

The predistored IF signal is multiplied in mixer 32 by the carrier frequency output fc of carrier oscillator 31 and the resulting up-converted RF signal is applied to microwave amplifier 34. Microwave amplifier 34 amplifies the up-converted RF signal for transmission by antenna 37. A small amount of the output of amplifier 34 (which is a distorted-predistorted or converted signal) is coupled off by RF coupler 35 and fed back to a mixer 33 via line 36. Mixer 33 also is coupled to receive the carrier frequency fc from carrier frequency oscillator 31, so that it coherently down-converts the output of power amplifier 34 to IF. This IF signal is further down-converted to baseband and separated into respective I and Q components by quadrature demodulator 29.

Quadrature demodulator 29, like quadrature mixer 26, contains a 90° phase shifter (at the frequency of IF oscillator 28) and a pair of multipliers, which respectively receive SIN and COS signals at the IF oscillation frequency. The other inputs of the multipliers are derived from the output of mixer 33. The outputs of the multipliers are filtered through suitable low-pass filters whereby respective I and Q components, representative of the output of power amplifier 34, are supplied via lines 30I and 30Q to comparators 17I and 17Q.

The outputs of comparators 17I and 17Q are converted by A-D converters 38I and 38Q into a pair of N-bit digital words on lines 39I and 39Q to be added to the N-bit words produced on lines 22I and 22Q, respectively. The outputs of adders 19I and 19Q are coupled to write-in data lines 20I and 20Q of predistortion RAM 21.

In operation, predistortion RAM 21 may be loaded with prescribed correction codes, based upon measurements carried out on amplifier 34 or a training data sequence may be coupled through the system and correction codes may be derived from comparators 17I and 17Q to be written into the appropriate addresses of ROM 21, to thereby generate a table of predistortion symbol codes. In either case, for each symbol capable of being transmitted, ROM 21 will contain predistortion symbol codes for each I and Q component of the multiamplitude represented symbols that may be coupled through amplifier 34 for transmission via antenna 37. For steady state conditions and no variation in the AM/AM and AM/PM conversion characteristics of amplifier 34, the predistortion signal codes read out from RAM 21 in response to the address input on line 12 from shift register 11 will effectively cancel the distortion imparted by power amplifier 34. As a result, the I and Q component values of the amplifier output fed back via lines 30I and 30Q will match the reference values on lines 16I and 16Q produced by ROM 13. Therefore, each of the outputs of components 17I and 17Q has a zero value so that the updated values of the I and Q signal components to be written into the addressed locations of RAM 21, via lines 20I and 20Q, are the same as those read out on lines 22I and 22Q; namely, the contents of memory 21, for the symbol value or address code supplied over line 12, are refreshed.

Should there occur a variation in the AM/AM and AM/PM conversion characteristic of power amplifier 34, the outputs of comparators 17I and 17Q will be non-zero, so that the updated value of the N-bit I and Q predistortion codes stored in RAM 21 coupled over lines 20I and 20Q will be changed to new values, so that the system will adapt to changes in the non-linear characteristics of power amplifier 34. Thus, irrespective of the originally stored symbol value codes stored in ROM 21, by virtue of the feedback adaptive learning process performed by the system, the codes stored in RAM 21 will be appropriately updated or modified, so as to cause distortion-counteracting I and Q symbol value codes to be supplied from RAM 21 to microwave amplifier 34. As a result, the distortion-introducing behavior of amplifer 34 is continuously tracked, assuring the desired linearization of effective amplifier-signal thoughput.

In the foregoing explanation of the invention, the updating of the contents of RAM 21 was described as taking place once per symbol time, so as to effectively provide a continuous updating of the distortion codes contained in memory. However, as will be readily appreciated by those skilled in the art, the rate at which the distortion codes are modified may be varied as the case demands; where the phase and amplitude variations of power amplifier 34 are slow with respect to the data rate, the updating of the distortion codes need not be effected for each symbol time, so that the speed of the system can be improved.

In accordance with the above described system, it is possible to employ microwave amplifiers having very poor AM/AM and AM/PM conversion characteristics, with peak input drive levels near saturation without suffering significant performance degradation. Thus, the system avoids link margin losses associated with the common practice of operating power amplifiers at reduced power levels in an effort to obtain desirably low distortion.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. In a communication system wherein signals to be transmitted are coupled through a modulation distorting amplifier that subjects the signals to shifts in signal characteristics away from their intended values, an arrangement for compensating for the distorting action of said amplifier comprising:

first means, coupled to receive input signals representative of data to be transmitted, for generating first output signals representative of the intended output of said amplifier in the absence of its distortion action;

second means, coupled to receive said input signals, for storing predistored modulation signals to be coupled through said amplifier in response to said input signals, said predistortion signals having characteristics such that the distortion action of said amplifier is compensated thereby; and third menas, coupled to said first and second means and to the output of said amplifier, for modifying predistorted modulation signals stored in said second means, in response to changes in the distortion action of said amplifier.

2. An arrangement according to claim 1, wherein said third means comprises means, coupled to said first means and to the output of said amplifier, for comparing the output of said amplifier with first output signals generated by said first means, and for causing the predistortion modulation signals stored in said second means to be changed in response to a difference between the output of said amplifier and said first output signals.

3. An arrangement according to claim 2, wherein said third means further includes means, coupled to the output of said second means and said comparing means, for modifying the values of predistortion signals stored in said second means and read out therefrom, in accordance with the value of the difference between the output of said amplifier and said first output signals.

4. An arrangement according to claim 1, wherein said input signals comprise digital codes representative of multiamplitude modulation signals to be coupled through said amplifier, and said first means comprises means, responsive to a digital code applied thereto, for generating a pair of output digital codes respectively representative of the intended in-phase and quadrature values that define a symbol to be produced as the output of said amplifier for transmission.

5. An arrangement according to claim 3, wherein said input signals comprise digital codes representative of multiamplitude modulation signals to be coupled through said amplifier, and said first means comprises means, responsive to a digital code applied thereto, for generating a pair of output digital codes respectively representative of the intended in-phase and quadrature values that define a symbol to be produced as the output of said amplifier for transmission.

6. An arrangement according to claim 5, wherein said second means comprises a memory in which digitally encoded pairs of in-phase and quadrature predistortion signal values are stored and read out therefrom in response to receipt thereby of said digital codes applied thereto as said input signals.

7. An arrangement according to claim 6, wherein the digitally encoded pairs of in-phase and quadrature symbols read out from said memory are applied as respective inputs to said modifying means.

8. An arrangement according to claim 6, further comprising means for converting the digitally-encoded pairs of in-phase and quadrature signals read out from said memory into analog symbols and for up-converting and combining said analog signals into composite signals for transmission at microwave frequencies.

9. An arrangement according to claim 7, wherein said modifying means includes means for adding to said digitally-encoded pairs of in-phase and quadrature signals further digital code signals corresponding to respective values of the in-phase and quadrature components of said difference between the output of said amplifier and said pair of output digital codes.

10. An arrangement according to claim 9, further comprising means for converting the digitally-encoded pairs of in-phase and quadrature signals read out from said memory into analog signals and for up-converting and combining said analog signals into composite signals for transmission at microwave frequencies.

11. An arrangement according to claim 6, wherein said second means comprises an input storage means, a prescribed number of said digital codes in length, for receiving said digital codes and causing said digitally encoded pairs of in-phase and quadrature predistortion signals to be read out from said memory in accordance with the digital code value contained in said input storage means.

12. An arrangement according to claim 11, wherein the digitally encoded pairs of in-phase and quadrature signals read out from said memory are applied as respective inputs to said modifying means.

13. An arrangement according to claim 12, wherein said modifying means includes means for adding to said digitally-encoded pairs of in-phase and quadrature signals further digital code signals corresponding to respective values of the in-phase and quadrature components of said difference between the output of said amplifier and said pair of output digital codes.

14. An arrangement according to claim 7, further comprising means for converting the digitally-encoded pairs of in-phase and quadrature signals read out from said memory into analog signals and for up-converting and combining said analog signals into composite signals for transmission at microwave frequencies.

15. An arrangement according to claim 14, wherein said modifying means includes means for adding to said digitally-encoded pairs of in-phase and quadrature signals further digital code signals corresponding to respective values of the in-phase and quadrature components of said difference between the output of said amplifier and said pair of output digital codes.

16. An arrangement according to claim 15, wherein said third means comprises means, coupled to the output of said amplifier, for down-converting the output of said amplifier to lower frequency in-phase and quadrature components to be applied to said comparing means.

17. An arrangement according to claim 16, wherein said second means comprises an input storage means, a prescribed number of said digital codes in length, for receiving said digital codes and causing said digitally encoded pairs of in-phase and quadrature predistortion signals to be read out from said memory in accordance with the digital code values contained in said input storage means.

* * * * *